US006329696B1

(12) United States Patent
Tanaka

(10) Patent No.: US 6,329,696 B1
(45) Date of Patent: Dec. 11, 2001

(54) SEMICONDUCTOR DEVICE WITH ELECTRIC CONVERTER ELEMENT

(75) Inventor: Akio Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/095,590

(22) Filed: Jun. 11, 1998

(30) Foreign Application Priority Data

Jun. 11, 1997 (JP) .................................... 9-153864

(51) Int. Cl.[7] .................................................. H01L 29/82
(52) U.S. Cl. .......................... 257/419; 257/417; 257/426
(58) Field of Search .................................. 257/417, 419, 257/426, 431, 432, 443, 444, 454, 455; 250/338.4, 332, 370.14, 370.15; 348/294, 301, 308, 320; 438/50–53; 73/754, 514.2

(56) References Cited

U.S. PATENT DOCUMENTS

| 4,940,509 | * | 7/1990 | Tso et al. ............................ 156/653 |
| 5,286,976 | | 2/1994 | Cole . |
| 5,640,013 | * | 6/1997 | Ishikawa et al. ................. 250/338.4 |
| 5,656,816 | * | 8/1997 | Tanaka ............................. 250/339.01 |
| 5,698,852 | * | 12/1997 | Tanaka et al. ....................... 250/332 |
| 5,965,892 | * | 10/1999 | Tanaka ............................. 250/370.08 |
| 6,051,846 | * | 4/2000 | Burns et al. ........................... 257/35 |

FOREIGN PATENT DOCUMENTS

| 5728223 | 2/1982 | (JP) . |
| 59193324 | 11/1984 | (JP) . |
| 328702 3 | 12/1991 | (JP) . |
| 5-40064 | 2/1993 | (JP) . |
| 516460 5 | 6/1993 | (JP) . |
| 621517 | 1/1994 | (JP) . |
| 6-147993 | 5/1994 | (JP) . |
| 755557 | 3/1995 | (JP) . |
| 714618 7 | 6/1995 | (JP) . |
| 722515 2 | 8/1995 | (JP) . |
| 8-105794 | 4/1996 | (JP) . |
| WO 9624165 | 8/1996 | (WO) . |

OTHER PUBLICATIONS

Japan Journal of Solid–State Physics, vol. 30, No. 1, 1995, pp. 15–25.
G. P. Keller et al., "Synthesis, Properties, and Ternary Phase Stability of $M_6X$ Compounds in the Ti–Cu–O System" Journal of American Ceramic Society, vol. 76, No. 7, 1993, pp. 1815–1820.
T. Hase et al., "Synthesis of Single Phase $YBa_2Cu_3)_{7-x}$ Thin Films From a Y–Ba–Cu Metallic Precursor By a Low–Temperature Annealing", Journal of Materials Research, vol. 9, No. 6, 1994, pp. 1337–1341.

* cited by examiner

Primary Examiner—Charles Bowers
Assistant Examiner—Brook Kebede
(74) Attorney, Agent, or Firm—Young & Thompson

(57) ABSTRACT

A semiconductor device with an electric converter element on a diaphragm is provided, in which the diaphragm has an improved thermal shielding or blocking capability from a semiconductor substrate without lowering the mechanical strength of a leg of the diaphragm. The semiconductor device includes of a semiconductor substrate, a diaphragm mechanically connected to the substrate by a thermally-resistive leg, an electric converter element provided on the diaphragm, an electronic circuit formed on the substrate, and an electric path located on the leg for electrically connecting the electric converter element and the electronic circuit. The diaphragm is electrically insulated and thermally separated from the substrate. The electric converter element conducts a conversion between a physical quantity and an electric input/output signal. The electric path is made of a metal suicide to decrease its thermal conductivity without decreasing its electrical conductivity. The device is applicable to various sensors, generators, and actuators using heat.

10 Claims, 13 Drawing Sheets

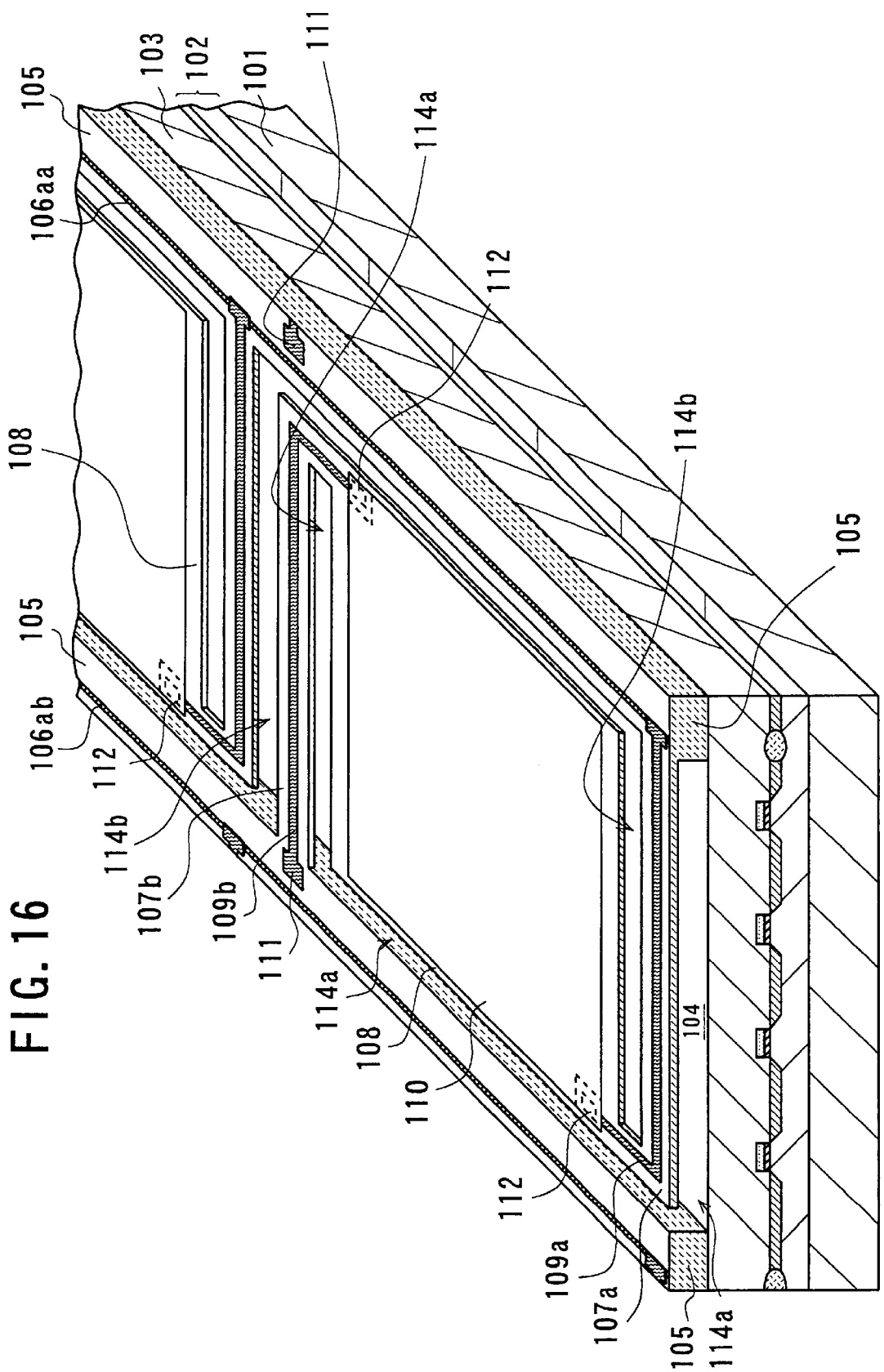

SEMICONDUCTOR DEVICE WITH ELECTRIC CONVERTER ELEMENT

BACKGROUND OF THE INVENTION

1. Field of the Invention

The present invention relates to a semiconductor device and more particularly, to a semiconductor devise with an electric converter element such as thermoelectric or electro-thermal converter, which is applicable to various sensors, generators, and actuators using heat, such as an Infrared (IR)-ray sensor, flow sensor, gas sensor, pressure sensor, vacuum sensor, IR-ray generator, and manipulator.

2. Description of the Prior Art

A semiconductor sensor device or semiconductor micro-sensor using heat is typically comprised of a semiconductor substrate, a heat-sensing or heat-input microstructure formed over the substrate and thermally shielded or separated therefrom, and an electronic circuit for processing an electric output signal from the microstructure. The microstructure usually has a thermoelectric converter element to produce the electric output signal according to the heat or temperature of the microstructure.

An example of the conventional semiconductor sensor devices of this sort is shown in FIGS. 1 and 2, which serves as an IR-ray sensor This sensor device is disclosed in the Japanese Non-examined Patent Publication No. 8-105794 published in 1996.

As shown in FIGS. 1 and 2, this conventional semiconductor sensor device includes a lot of rectangular diaphragms 613 as the heat-input microstructures, which are arranged in a matrix array on a semiconductor substrate 601.

As shown in FIG. 2, although roughly illustrated, a scanning circuit 602 is formed on a main surface of the semiconductor substrate 601. The scanning circuit 602 includes Metal-Oxide-semiconductor Field-Effect Transistors (MOSFETs) (not shown). Polysilicon vertical selection lines 603 are formed over the scanning circuit 602 to scan or select the diaphragms 613.

A silicon dioxide ($SiO_2$) layer 635 is formed to cover the scanning circuit 602 and the vertical selection lines 603. Cavities 604 with a same rectangular plan shape are formed in the $SiO_2$ film 605.

Aluminum (Al) ground lines 606 and aluminum signal lines 607 are formed on the $SiO_2$ layer 605. Titanium (Ti) bolometers 608 serving as thermoelectric converter elements are formed on the $SiO_2$ layer 605 to be overlapped with the corresponding cavities 604. The signal lines 607 are electrically connected to the scanning circuit 602 through contact holes 612 penetrating the $SiO_2$ layer 605.

Another $SiO_2$ layer 609 is formed to cover the bolometers 608, the ground lines 606, the signal lines 607, and the exposed $SiO_2$ layer 605.

An IR-ray absorption layer 610 is selectively formed on the $SiO_2$ layer 609 to be overlapped with the diaphragms 613. The layer 610 is made of titanium nitride (TiN).

As shown in FIGS. 1 and 2, folded slits 611a and 611b are formed to penetrate the $SiO_2$ layers 609 and 605 and to surround the corresponding zigzag-shaped bolometers 608. The slits 611a and 611b extend to the underlying cavities 604 in the $SiO_2$ layer 605, thereby defining the rectangular diaphragms 613 which are matrix-arranged over the substrate 601. The diaphragms 613 thus defined by the patterned $SiO_2$ layer 609 are thermally separated from the substrate 601 by the corresponding cavities 604 and from the adjoining parts of the $SiO_2$ layers 609 and 605 by the slits 611a and 611b. Thus, it is said that the diaphragms 613 are thermally shielded or isolated from the substrate 601. The bolometers 608 are located on the corresponding diaphragms 613.

As seen from FIGS. 1 and 2, each of the diaphragms 613 has two legs 613a and 613b that are mechanically connected to the substrate 601 through the remaining $SiO_2$ layer 605. Each of the legs 613a and 613b is sandwiched by the adjoining slits 611a and 611b.

Each of the bolometers 608 is comprised of a zigzag-shaped central part 608c and two end parts 608a and 608b located on the legs 613a and 613b of a corresponding one of the diaphragms 613. The end parts 608a and 608b of the bolometer 608 are located on the legs 613a and 613b of the diaphragm 613 to extend along them, respectively. The end parts 608a and 608b of the bolometer 608 are electrically connected to the signal lines 607 which are electrically connected to the scanning circuit 602.

The cavities 604 formed in the $SiO_2$ layer 605 are implemented by forming a sacrificial polysilicon layer, patterning the sacrificial polysilicon layer, and removing the patterned, sacrificial polysilicon layer. This removing process is performed by wet etching while an etching solution is contacted with the sacrificial polysilicon layer through the slits 611a and 611b.

With the conventional semiconductor sensor device shown in FIGS. 1 and 2, all the rectangular diaphragms 613 arranged on the substrate 601 in a matrix array are electrically scanned by the scanning circuit 602 on operation.

When an incident IR-ray is irradiated to the diaphragms 613, it is absorbed by the IR absorption layer 610 to thereby change the temperature of the diaphragms 613. The temperature change thus caused is converted to an electric output signal by the bolometers 608 on the diaphragms 613 and then, the electric output signal is read out to the outside of the conventional semiconductor sensor device.

The above-described conventional semiconductor sensor device shown in FIGS. 1 and 2 has the following problems.

A first problem is that the thermal shielding or blocking capability of the diaphragms 613 is unsatisfactory. This problem is applicable to any other semiconductor sensor devices.

Each of the diaphragms 613 is mechanically connected to the substrate 601 by the elongated legs 613a and 613b. The end parts 608a and 608b of the corresponding bolometer 608 a relocated on the legs 613a and 613b to thereby electrically connect the bolometer 608 to the signal lines 607. The end parts 608a and 608b are typically made of popular metal such as titanium (Ti) to decrease their electric resistance. Since metals with a high electrical conductivity generally have a high thermal conductivity, the heat generated in each diaphragm 613 tends to be readily transmitted to the substrate 601. This means that the thermal shielding or blocking capability of each diaphragm 613 will degrade.

The bolometer 608 may be made of oxide semiconductor while the end parts 608a and 608b thereof are made of metal. However, in this case, there is the same problem as above.

This first problem can be solved by decreasing the cross section of the legs 613a and 613b of the diaphragm 613. However, in this case, there arises another problem that the mechanical strength of the legs 613a and 613b is lowered The decrease of the mechanical strength of the legs 613a and 613b increases the danger that the diaphragm 613 is mechanically contacted with the underlying $SiO_2$ layer 605 due to fluctuation or deviation of the process parameters in the fabrication process sequence of the conventional semiconductor sensor device, resulting in lowering of the fabrication yield.

A second problem is that the sensitivity of the bolometers 608 is unsatisfactorily low. This is because the bolometers 608 are made of Ti having a Temperature Coefficient of electric Resistance (TCR) as low as approximately 0.25% /K.

The bolometer 608 may be made of a vanadium oxide ($VO_x$) or titanium oxide ($TiO_x$). In this case, however, vanadium is not used in the popular fabrication processes of silicon ICs and as a result, it requires a dedicated process line. This means that the vanadium-based bolometer is difficult to be actually utilized.

If $TiO_x$ is used for the bolometer 608, there arises another problem that the 1/f noise of the bolometer 608 becomes high due to the high electrical resistivity of $TiO_x$.

Additionally. U.S. Pat. No. 5,2136,976 issued in 1994 discloses that the bolometer is made of vanadium oxide ($V_2O_3$ or $VO_x$) or titanium oxide ($TiO_x$).

The Japanese Non-examined Patent Publication No. 6-147993 published in 1994 discloses that the bolometer is made of polysilicon.

The Japanese Non-examined Patent Publication No. 5-40064 published in 1993 discloses that the thermoelectric converter element (i.e., bolometer) is implemented by using the temperature dependence of the backward saturation current of a Schottky diode.

SUMMARY OF THE INVENTION

Accordingly, an object of the present invention is to provide a semiconductor device with an electric converter element on a diaphragm in which the diaphragm has an improved thermal shielding or blocking capability from a semiconductor substrate without lowering the mechanical strength of a leg of the diaphragm.

Another object of the present invention is to provide a semiconductor device with an electric converter element on a diaphragm in which the diaphragm has an improved thermal shielding or blocking capability from a semiconductor substrate without degrading the fabrication yield.

Still another object of the present invention is to provide a semiconductor device with an electric converter element on a diaphragm that improves the signal-to-noise ratio (S/N).

The above objects together with others not specifically mentioned will become clear to those skilled in the art from the following description.

A semiconductor device according to the present invention is comprised of a semiconductor substrate, a diaphragm mechanically connected to the substrate by a thermally-resistive leg, an electric converter element provided on the diaphragm, an electronic circuit formed on the substrate, and an electric path located on the leg for electrically connecting the electric converter element and the electronic circuit.

The diaphragm is electrically insulated and thermally separated from the substrate.

The electric converter element conducting conversion between a physical quantity and an electric input/output signal.

The electric path is made of metal silicide (e.g., titanium silicide, tungsten silicide, cobalt suicide, and so on) to decrease its thermal conductivity without decreasing its electrical conductivity.

With the semiconductor device according to the present invention, since the electric path is made of metal suicide having a low electric resistance and a high thermal resistance, the heat transmission between the diaphragm and the substrate through the electric path is suppressed. This is performed without decreasing the cross section of the leg.

As a result, the diaphragm has an improved thermal shielding or blocking capability from the substrate without lowering the mechanical strength of the leg of the diaphragm and without degrading the fabrication yield.

Also, the electric path is made of metal silicide and therefore, the electric resistance of the electric path is decreased to thereby reduce the voltage drop caused by the electric path.

Thus, the (S/N) is improved without degrading the fabrication yield.

When the 1/f noise level in the electric converter element is lowered, the (S/N) is further improved.

In a preferred embodiment of the semiconductor device according to the present invention, the electric path is made of titanium silicide expressed as $TiSi_x$, where x is 1.5 to 2.5. In this case, there is an additional advantage that the electric resistance can be decreased further.

It is preferred that the value of x is 1.8 to 2.2. In this case, the electric resistance is limited to a lower range compared with the case where x is 1.5 to 2.5.

It is more preferred that the value of x is 1.9 to 2.1. In this case, the electric resistance is limited to a lower range compared with the case where x is 1.8 to 2.2.

In another preferred embodiment of the semiconductor device according to the present invention, titanium silicide has a crystal structure of C54. In this case, the electric resistance can be decreased further.

In still another preferred Embodiment of the semiconductor device according to the present invention, the electric converter element is made of metal silicide. In this case, there is an additional advantage that the 1/f noise level is lowered to thereby improve the (S/N) furthermore.

It is preferred that the electric converter element is made of titanium silicide.

In a further preferred embodiment of the semiconductor device according to the present invention, the electric converter element is made of a material selected from the group consisting of $Ti_xO_y$, $Cu_xO_y$, and $Cu_xTi_yO_z$, each of which is doped with an impurity having an action to decrease its electric resistivity.

The amount of the doped impurity is determined so as to realize a wanted value of the decreased electric resistivity.

In this case, the electric converter element has a large temperature coefficient of electric resistance and a low 1/f-noise level. This means the increase of the signal level and the decrease of the noise level. Therefore, the S/N is highly improved.

Preferably, the doped impurity for $Ti_xO_y$ is at least one selected from the group consisting of In, Sn, Nb, Ba, Sr, Pb, Zr, Cu, Pt, Co, Ru, and Ta, and their compounds. These materials are readily treated in the popular fabrication processes for silicon ICs. In these elements and compounds, Ba and Sr and their compounds are more preferably because the action of decreasing the electric resistivity is relatively stronger.

Preferably, the doped impurity for $Cu_xO_y$ is at least one selected from the group consisting of Ba, Sr, Pb, Zr, Ti, Pt, Co, Ru, and Ta, and their compounds. These materials are readily treated in the popular fabrication processes for silicon ICs. In these elements and compounds, Ba and Sr and their compounds are more preferably because the action of decreasing the electric resistivity is relatively stronger.

Preferably, the doped impurity for $Cu_xTi_yO_z$ is at least one selected from the group consisting of In, Sn, Nb, Ba, Sr, Pb, Zr, Cu, Pt, Co, Ru, and Ta, and their compounds. These materials are readily treated in the popular fabrication processes for silicon ICs In these elements and compounds, Ba and Sr and their compounds are more preferably because the action of decreasing the electric resistivity is relatively stronger.

In a still further preferred embodiment of the semiconductor device according to the present invention, the diaphragm has a two-layer structure formed by a lower sublayer with a tensile stress and an upper sublayer with a compressive stress. The upper sublayer is stacked onto the lower sublayer. The two-layer structure has a bimetal function to form a convex cross-section with respect to the substrate.

In this case, it is preferred that the lower sublayer has an area of approximately ¾ times as much as the diaphragm or less. There is an additional advantage that a problem relating to the after image is prevented from occurring, thereby improving the fabrication yield.

In a still further preferred embodiment of the semiconductor device according to the present invention, the electric converter element has approximately a same electric resistance as that of the electric path on the leg.

In this case, there is an additional advantage that the voltage drop generated in electric path is further lowered.

BRIEF DESCRIPTION OF THE DRAWINGS

In order that the present invention may be readily carried into effect, it will now be described with reference to the accompanying drawings.

FIGS. 4A to 4I are partial, cross-sectional views along the line 4—4 in FIG. 3, respectively, which show a fabrication method of the semiconductor device according to the first embodiment of FIG. 3.

FIG. 16 is a partial, perspective view of a semiconductor device according to a fifth embodiment of the present invention.

DETAILED DESCRIPTION OF THE PREFERRED EMBODIMENTS

Figure 1:
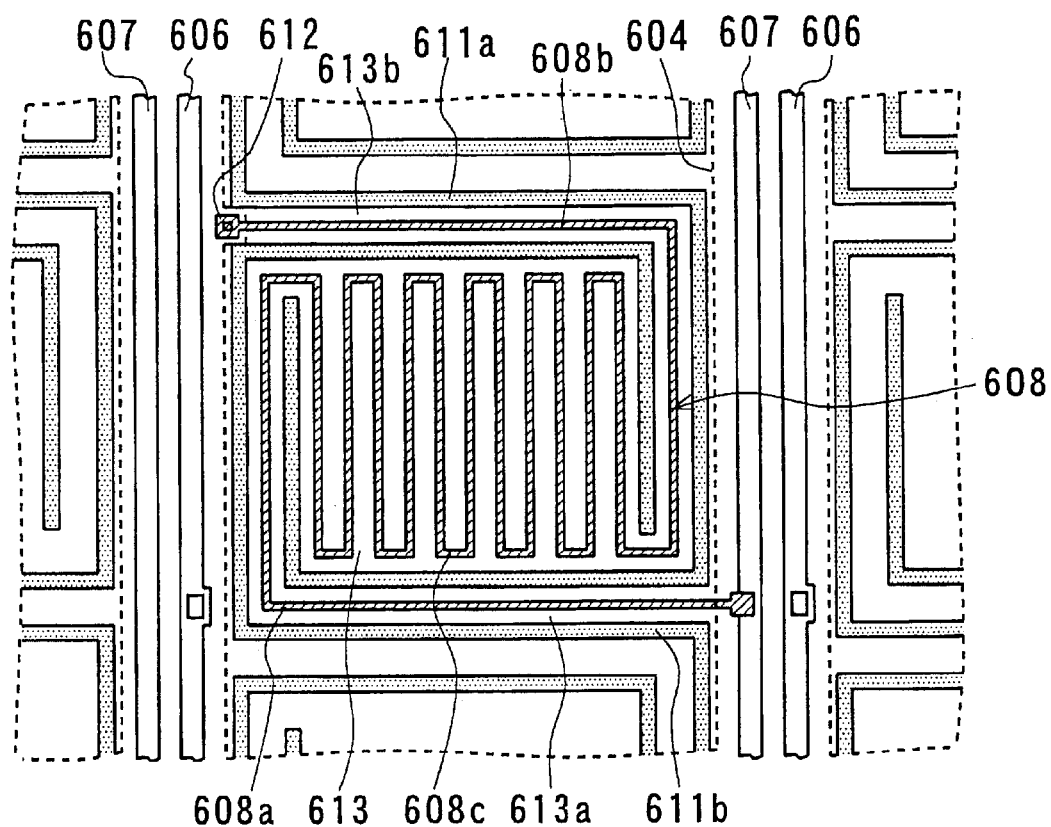
FIG. 1 is a partial, plan view of a conventional semiconductor sensor device.
Figure 2:
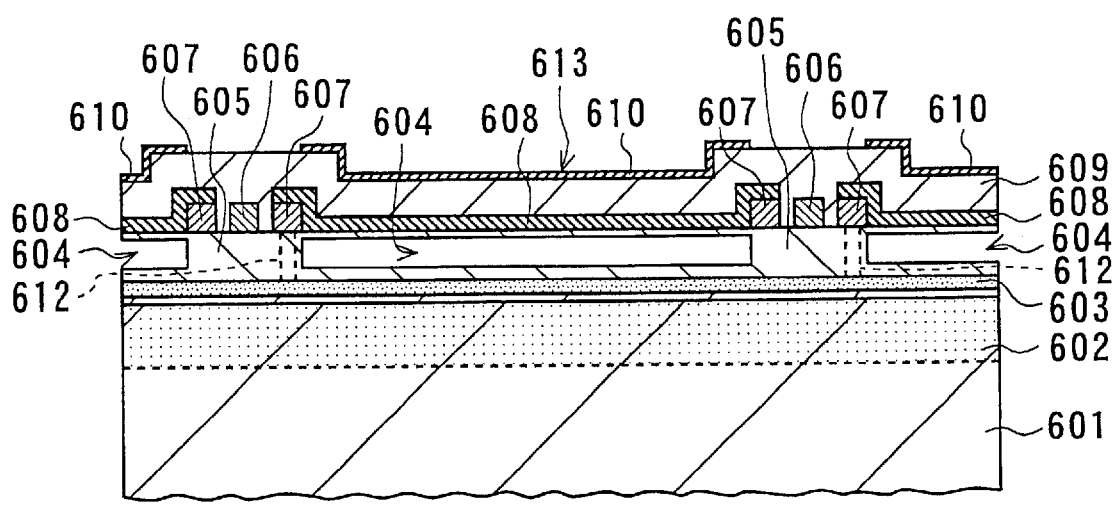
FIG. 2 is a partial, cross-sectional view of the conventional semiconductor sensor device of FIG. 1.

Preferred embodiments of the present invention will be described in detail below while referring to the drawings attached.

FIRST EMBODIMENT

Figure 3:
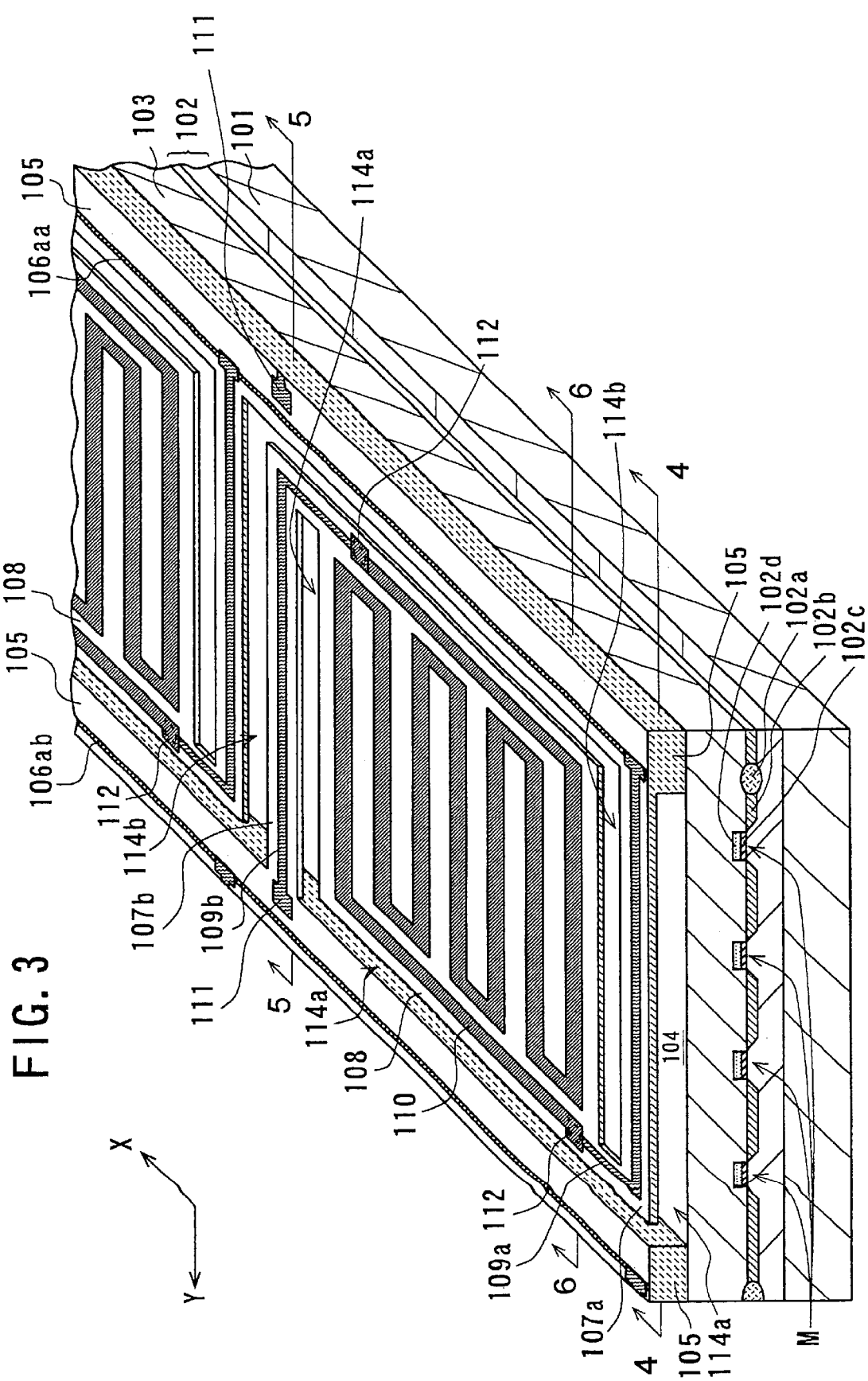
FIG. 3 is a partial, perspective view of a semiconductor device according to a first embodiment of the present invention.

FIG. 3 schematically shows the configuration of a semiconductor device according to a first embodiment of the present invention, which serves as an IR micro-sensor device.

As shown in FIG. 3, this semiconductor device includes a plurality of IR receiving sections or pixels arranged in a matrix array. Each of the IR receiving sections has a diaphragm 108 and thermoelectric converter (i.e., IR bolometer) 110.

An integrated circuit 102 is formed on a main surface of a single-crystal silicon (Si) substrate 101. The integrated circuit 102 includes a plurality of MOSFETs M formed in corresponding device regions, which are electrically isolated from one another by an isolation oxide 102a. Each of the MOSFETs M is formed by a pair of source/drain regions 102b, a gate oxide layer 102c, and a gate electrode 102d. The integrated circuit 102 is covered with an interlayer dielectric layer 103. Here, the layer 103 is made of $SiO_2$.

A dielectric layer 105, which is made of $SiO_2$, is formed on the interlayer dielectric layer 103. Between the adjoining two parts of the dielectric layer 105, cavities 104 are formed on the $SiO_2$ layer 103. Each of the cavities 104 extends along the X direction in FIG. 3. The dielectric layer 105. which has a linear shape extending along the X direction and which is mechanically connected to the interlayer dielectric layer 103, constitute supports of the diaphragms 108 overhanging the corresponding cavities 104.

The diaphragms 108 extend along the Y direction in FIG. 3 from the corresponding supporting parts of the dielectric layer 105. The rectangular diaphragms 108 and the pairs of L-shaped legs 107 a and 107 b are defined by zigzag-shaped slits 114a and 114b. Each of the diaphragms 108 is mechanically supported by a corresponding one of the pairs of legs 107a and 107b at its opposite ends. The pair of legs 107a and 107b are mechanically connected to the supporting parts of the dielectric layer 105 located at the opposite sides, respectively.

Zigzag-shaped thermoelectric converter elements 110 (i.e. IR bolometers) are provided on the respective diaphragms 108. Both ends of each converter element 110 are electrically connected to leg wiring lines 109a and 109b located on the legs 107a and 107b at contact holes 112, respectively.

The leg wiring lines 109a and 109b are electrically connected to circuit wiring lines 106aa and 106ab, respectively. The circuit wiring lines 106aa and 106ab are electrically connected to the IC circuit 102.

Because each of the diaphragms 108 is apart from the interlayer dielectric layer 103 except: for the thermally-resistive legs 107a and 107b, it is thermally separated from the interlayer dielectric layer 103.

Also, since this semiconductor device according to the first embodiment is encapsulated by a vacuum package and operated in a vacuum atmosphere, heat transmission of the diaphragms 108 to the substrate 101 is performed only by conduction through the legs 107a and 107b and by radiation. Thus, it is said that the diaphragms 108 are thermally separated or isolated from the ambient atmosphere on operation.

Figure 6A:
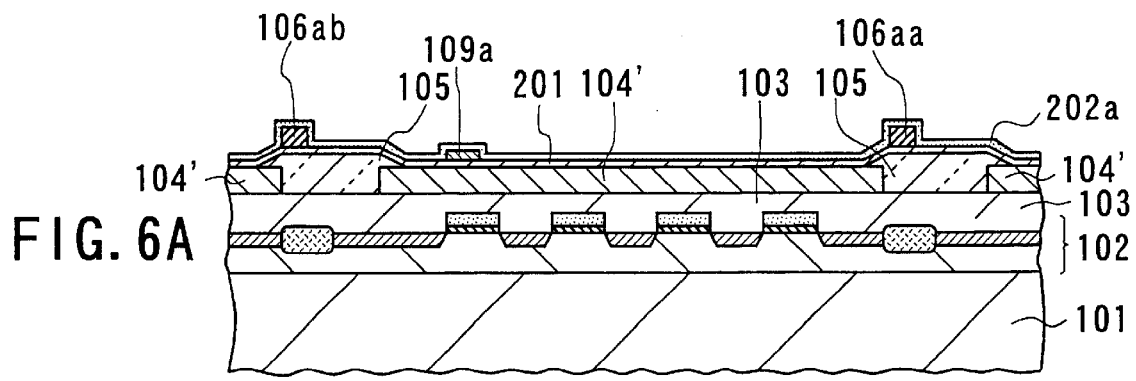
FIGS. 6A to 6D are partial, cross-sectional views along the line 6—6 in FIG. 3, respectively, which show the fabrication method of the semiconductor device according to the first embodiment of FIG. 3.
Figure 6B:
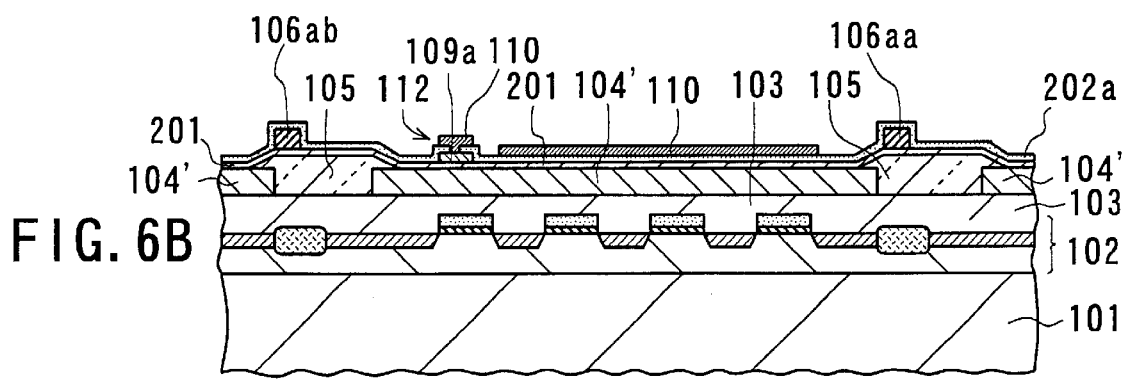
Figure 6C:
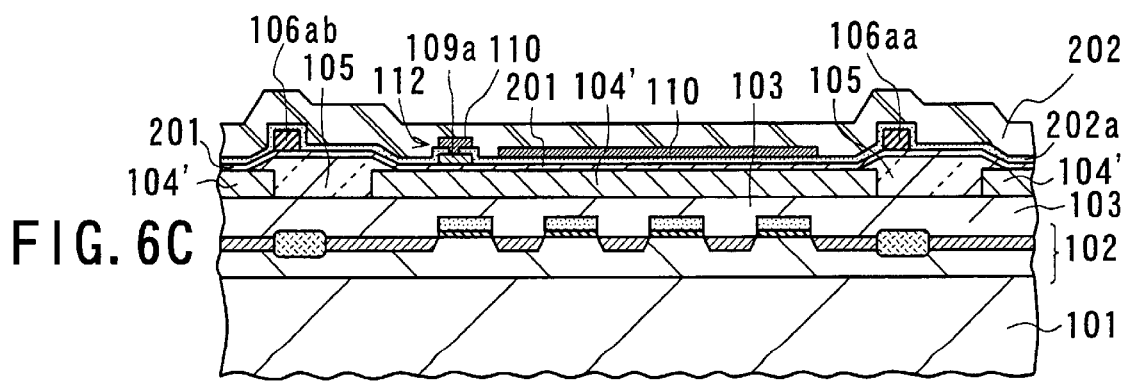
Figure 6D:
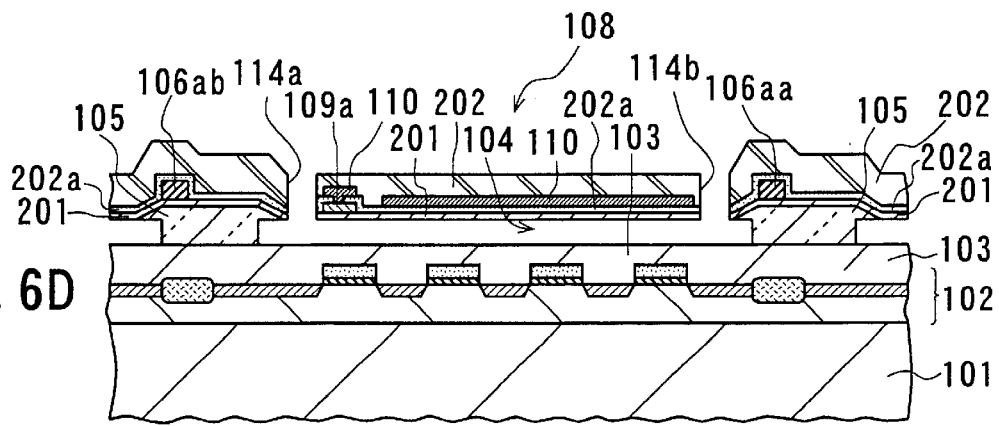
Figure 7:
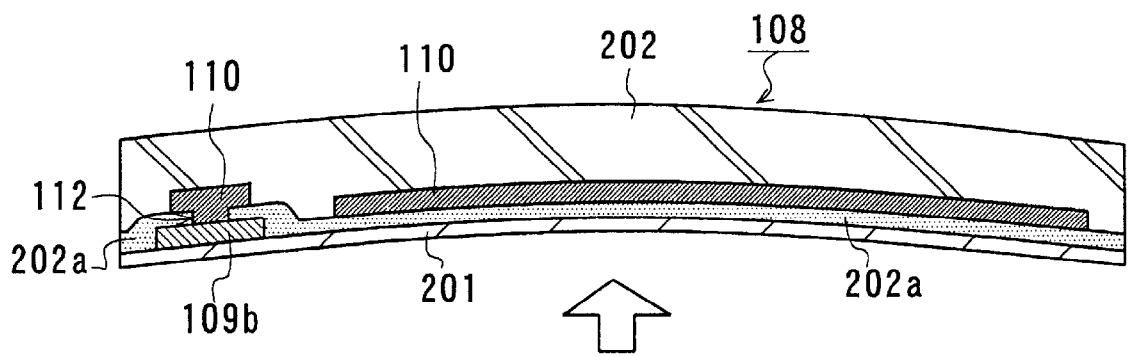
FIG. 7 is an enlarged, partial. cross-sectional view of the diaphragm of the semiconductor device according to the first embodiment of FIG. 3.

The detailed configuration of each diaphragm 108 is shown in FIGS. 6D and 7.

As seen from FIGS. 6D and 7, each diaphragm 108 is formed by a dielectric layer 201 having a tensile stress, the leg wiring lines 109a and 109b formed on the dielectric layer 201, a dielectric layer 202a formed on the dielectric layer 201 to cover the leg wiring lines 109a and 109b, the thermoelectric converter elements 110 formed on the dielectric layer 202a, and a dielectric layer 202 having a compressive stress formed on the dielectric layer 202a to cover the thermoelectric converter element 110. The thermoelectric converter element 110 is mechanically contacted with and electrically connected to the leg wiring lines 109a and 109b.

Because of the tensile stress in the lowermost dielectric layer 201 and the compressive stress in the uppermost dielectric layer 202, in other words, because of the "bimetal" effect generated by these two opposite stresses, the diaphragm 108 is slightly warped upward, as shown in FIG. 7. This warped diaphragm 108 will produce an additional advantage that the diaphragm 108 is more difficult to be contacted with the underlying interlayer dielectric layer 103 compared with the case where the diaphragm 108 has no warp.

As the dielectric layer 201 having a tensile stress, a silicon nitride layer produced by a Low-Pressure CVD (LPCVD) process is preferably used. As the dielectric layer 202 having a compressive stress, a silicon oxide layer produced by a plasma-assisted CVD process is preferably used.

The preferred thickness of the dielectric layer 201 having a tensile stress is approximately 5 to 50 nm, because a good warp of the diaphragm 108 is realized within this range. It is more preferred that the thickness of the dielectric layer 201 having a tensile stress is approximately 15 to 30 nm, because a better warp of the diaphragm 108 is realized within this range without any excessive warp. In this case, the preferred thickness of the dielectric layer 202 having a compressive stress is approximately 30 to 1500 nm, because a good warp of the diaphragm 108 is realized within this range.

Figure 12:
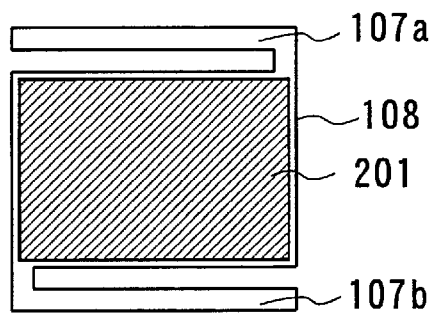
FIG. 12 is a partial, plan view showing the pattern of the diaphragm of the semiconductor device according to the first and second embodiments of FIGS. 3 and 8.

In this first embodiment. as shown in FIG. 12, the dielectric layer 201 having a tensile stress covers all the surface of the diaphragm 108. However, in this case, there is a problem that an after image tends to be generated when the dielectric layer 201 is made of silicon nitride. Although the cause of this problem is not clear, it seems that the problem is caused by some thermal traps produced in silicon nitride.

Accordingly, when the semiconductor device according to the first embodiment is used in the application where the after image causes no problem, the dielectric layer 201 having a tensile stress may cover almost all the surface of the diaphragm 108, as shown in FIG. 12.

Figure 13:
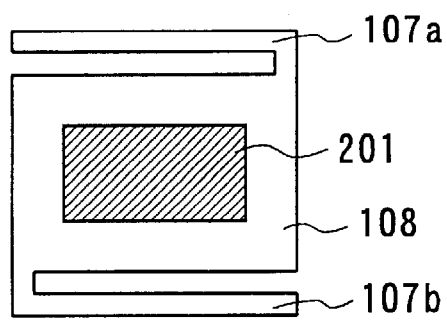
FIG. 13 is a partial, plan view showing the pattern of the diaphragm of the semiconductor device according to the third embodiment of FIG. 11.
Figure 14:
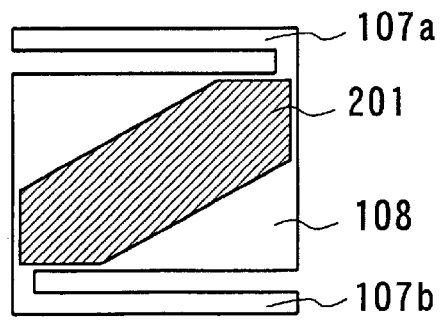
FIG. 14 is a partial, plan view showing a variation of the pattern of the diaphragm of the semiconductor device according to the third embodiment of FIG. 11.

On the other hand, when the semiconductor device according to the first embodiment is used in the application where the after image causes some problem, the dielectric layer 201 having a tensile stress needs to be formed to cover a part of the surface of the diaphragm 108. as shown in FIG. 13 or 14. In FIG. 13, the dielectric layer 201 is rectangular at the center of the diaphragm 108. In FIG. 14, the dielectric layer 201 is approximately rectangular along a diagonal line of the diaphragm 108.

Moreover, if the tensile stress of the dielectric layer 201 is excessively strong, the warp of the diaphragm 108 may be adjusted by changing the area (i.e., size) and/or shape of the dielectric layer 201. This is an additional advantage. For example, it was found from the inventor's test that the after image problem was able to be prevented from occurring by adjusting the area or size of the dielectric layer 201 to be equal to ¾ of the whole area of the diaphragm 108 or less.

The leg wiring lines 109a and 109b and the thermoelectric converters (i.e., bolometers) 110 are located between the lowermost and uppermost dielectric layers 201 and 202 in this first embodiment. However, the leg wiring lines 109a and 109b and the thermoelectric converter elements 110 may be located within the dielectric layer 202. This structure is readily realized by forming a lower part of the dielectric layer 202 in a process step and forming the remainder of the dielectric layer 202 in a subsequent process step.

The leg wiring lines 109a and 109b are directly contacted with the underlying circuit wiring lines 106aa and 106b, thereby electrically connecting the leg wiring lines 109a and 109b to the circuit wiring lines 106aa and 106ab without any contact members, respectively.

Figure 5:
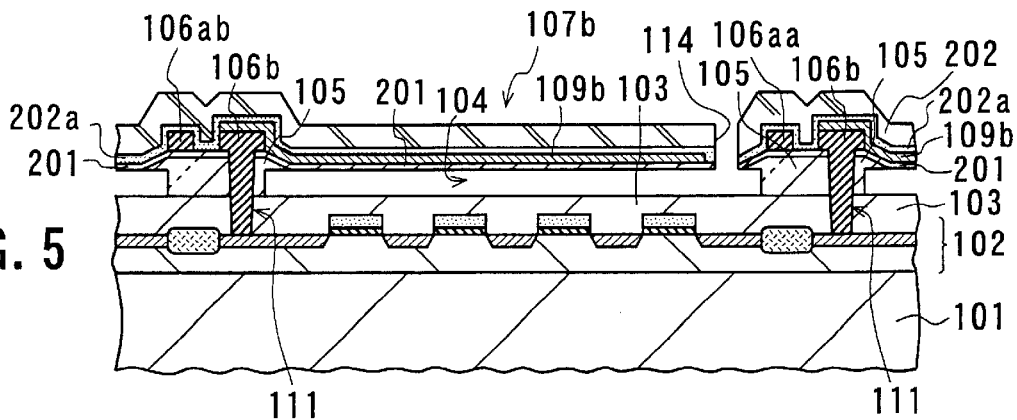
FIG. 5 is a partial, cross-sectional view along the line 5—5 in FIG. 3.

The circuit wiring lines 106aa and 106b are electrically connected to the corresponding source/drain regions 102b of the MOSFETs M in the IC 102 through the contact plugs 106b provided in the contact holes 111, as shown in FIG. 5.

The circuit wiring lines 106aa and 106b may be made of aluminum (Al) or an alloy of AlSi or AlSiCu, which are popularly used in the conventional IC fabrication processes.

Each of the thermoelectric converter element or IR bolometer 110 has a zigzag shape to increase its electric resistance, the reason of which is as follows.

The total electric resistance on each diaphragm 108 is expressed as the sum of the electric resistance of the thermoelectric converter element or bolometer 110, the leg wiring lines 109a and 109b, and the contact resistance. If the ratio of the converter element 110 with respect to the total electric resistance on each diaphragm 108 is set as a comparatively large value, the signal level decrease is suppressed. Thus, the S/N is improved.

When the electric resistivity of the thermoelectric converter element 110 is equal to approximately 10 $\mu\Omega$·cm to 1 m$\Omega$·cm, the electric resistance of the element 110 can be set as approximately 1 k$\Omega$ to 100 k$\Omega$ due to the zigzag shape. In this case, the width of the element 110 is preferably set as approximately 1 $\mu$m to 10 $\mu$m, and the thickness of the element 110 is preferably set as approximately 10 nm to 1 $\mu$m.

If the width of the element 110 is less than approximately 1 $\mu$m. the electric resistance of the element 110 tends to fluctuate. If the width of the element 110 is greater than approximately 10 $\mu$m, the electric resistance of the element 110 is difficult to be high. Also. if the thickness of the element 110 is greater than 1 μm, the electric resistance of the element 110 is difficult to be high. If the thickness of the element 110 is less than 10 nm. the interface of the element 110 tends to be affected by native oxide.

The detailed configuration of the legs 107a and 107b is shown in FIGS. 4I and 5, respectively.

As seen from FIG. 4I, each leg 107a is formed by the dielectric layer 201, the dielectric layer 202a formed on the dielectric layer 201 to cover the leg wiring line 109a, and the dielectric layer 202 formed on the dielectric layer 202a. The leg wiring line 109a is mechanically contacted with and electrically connected to the circuit wiring line 106aa.

As seen from FIG. 5, each leg 107b is formed by the dielectric layer 201, the dielectric layer 202a formed on the dielectric layer 201 to cover the leg wiring line 109b, and the dielectric layer 202 formed on the dielectric layer 202a. The leg wiring line 109b is mechanically contacted with and electrically connected to the circuit wiring line 106b.

The leg wiring lines 109b are electrically connected to the corresponding source/drain regions 102b of the MOSFETs M of the IC 102 through the corresponding contact plugs 106b provided in the contact holes 111.

Each of the leg wiring lines 109a and 109b preferably has a width of approximately 1 μm to 10 μm and a thickness of approximately 10 nm to 1 μm. If the width of the wiring lines 109a and 109b is less than approximately 1 μm, the electric resistance of the wiring lines 109a and 109b tends to fluctuate. If the width of the wiring lines 109a and 109b is greater than approximately 10 μm, the area of the diaphragm 108 becomes excessively narrow.

The material of the leg wiring lines 109a and 109b needs to have a low electric resistance to suppress the voltage drop in the legs 107a and 107b send at the sane time, it needs to have a low thermal conductivity to prevent the heat from being transmitted and to raise the sensitivity of the thermoelectric converter elements 108.

As the material of the leg wiring lines 109a and 109b, a silicide of metal (or, refractory metal) is preferably used. Especially, titanium silicide ($TiSi_x$) is most preferred because titanium silicide has a low thermal conductivity of approximately 0.2 W/cm·K which is approximately a same as titanium and has a low electric resistivity of approximately 30 μΩ·cm which is approximately equal to one-fourth (¼) of approximately 120 μΩ·cm of titanium. These data were given through the inventor's tests for the thin layers of approximately 100 nm in thickness.

Any other metal silicide than titanium silicide may be used for the invention. For example, tungsten silicide ($WSi_x$) and cobalt silicide ($CoSi_x$) may be preferably used instead of titanium silicide ($TiSi_x$), because these two silicides have a low electric resistivity compared with titanium and they may be popularly used in the typical fabrication processes for silicon ICs.

Next, a fabrication method of the semiconductor device according to the first embodiment is explained below with reference to FIGS. 4A to 4I, 5, and 6A to 6D.

Figure 4A:
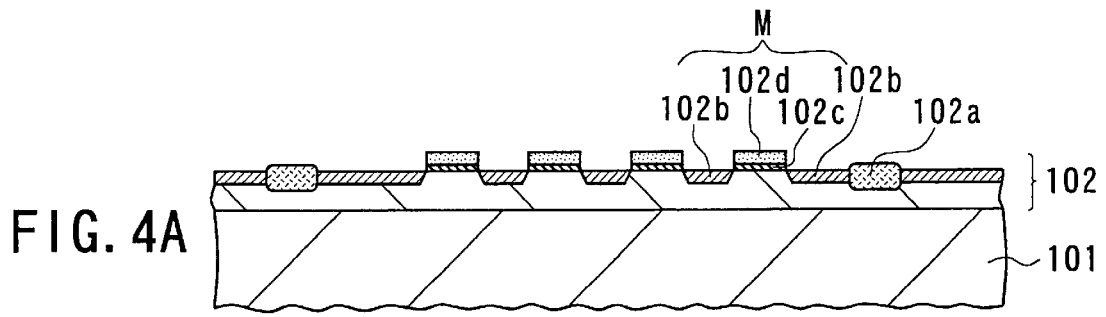

First, as shown in FIG. 4A, the IC 102 including the MOSFETs M are formed on the silicon substrate 101 through the popular fabrication processes of silicon ICs. The IC 102 preferably has the Complementary MOS (CMOS) structure because of its low power dissipation and less fabrication process steps. However, the IC 102 may have the Bipolar CMOS (Bi-CMOS) structure or it may be formed by bipolar transistors, because of its low noise and low electric resistance.

Figure 4B:
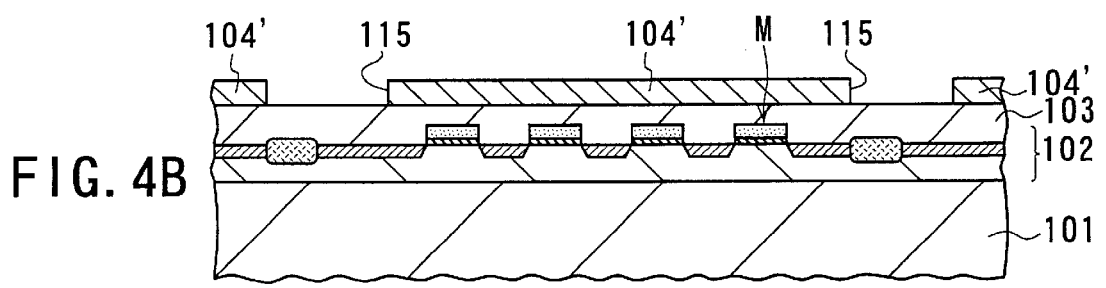

Second, as shown in FIG. 4B, the interlayer dielectric layer 103 is formed to cover the IC 102 by a Chemical Vapor Deposition (CVD) process or a Physical Vapor Deposition (PVD) process such as sputtering and evaporzation. The interlayer dielectric layer 103 may, be made of silicon dioxide ($SiO_2$), silicon nitride ($Si_3N_4$), or Boro-PhosphoSilicate Glass (BPSG). It is preferred that a BPSG layer formed by a CVD process is used as the interlayer dielectric layer 103, because of its good step-coverage property.

The thickness of the interlayer dielectric layer 103 needs to be determined so that the surface steps of the layer 103 caused by the isolation oxide 102a and the polysilicon gate electrodes 102d are planarized and at the same time, the contact holes 111 penetrating the layer 103 fire not excessively deep. Typically, the surface steps of the layer 103 is approximately 500 nm in height difference. Therefore, it is preferred that the thickness of the layer 103 is approximately 0.5 μm or more.

Actually, it was found through the inventor's test that the wanted contact holes are able to be formed when the interlayer dielectric layer 103 has a thickness of approximately 1 μm and the contact holes 111 have a square shape of approximately 1 μm.

Silica, which has been recently used in the fabrication processes for Ultra-Large Scale Integrated circuits (ULSIs) together with the Chemical/Mechanical Polishing method, may be used for the interlayer dielectric layer 103.

Third, a sacrificial layer 104' for forming the cavities 104 is formed on the interlayer dielectric layer 103. As the sacrificial layer 104', polysilicon or silicon oxide is preferably used. This is because polysilicon is etched by an alkali such as hydrazine or TMAH end silicon oxide is etched by hydrogen fluoride. When the sacrificial layer 104' is made of silicon oxide, the interlayer dielectric layer 103 needs to be made of silicon nitride to prevent the underlying interlayer dielectric layer 103 from being etched during the etching process of the sacrificial layer 104'.

The sacrificial layer 104' is then patterned to be left on the interlayer dielectric layer 103 by popular photolithography and etching techniques, thereby leaving the layer 104' at the corresponding location to the cavities 104, as shown in FIG. 4B. The reference numeral 115 denotes the etched space of the layer 103. A plasma-assisted etching process is preferably used for this purpose.

Figure 4C:
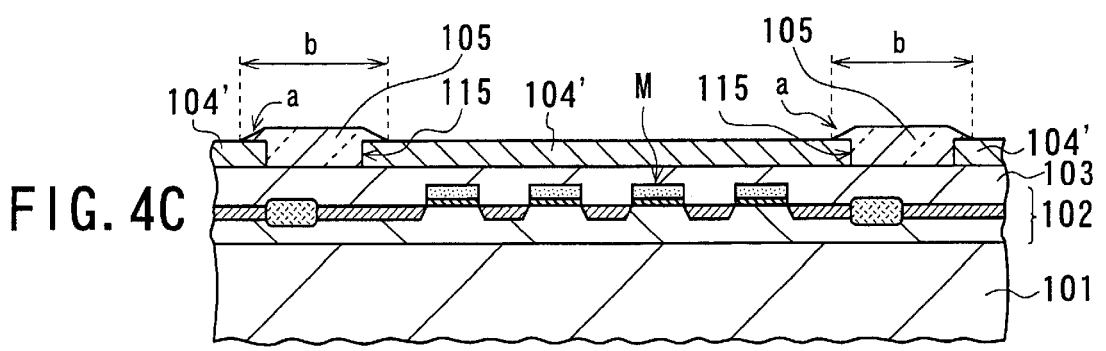

Fourth, the dielectric layer 105 is formed to bury the hollow spaces 115 between the islands of the sacrificial layer 104' over the whole substrate 101. The dielectric layer 105 is then patterned by etching to be left like islands. thereby burying the hollow spaces 115 of the remaining sacrificial layer 104', as shown in FIG. 4C.

The dielectric layer 105 may be made of the same material as the interlayer dielectric layer 103.

To prevent the leg wiring lines 109a and 109b extending over the top edges of the sacrificial layer 104' from being cut due to the steps generated at these top edges, the dielectric layer 105 needs to have a same thickness as the sacrificial layer 104' or to be slightly thicker than the sacrificial layer 104'.

The inventor's test showed that the thickness difference of the sacrificial layer 104' from the dielectric layer 105 was preferably zero to approximately 1 μm.

The preferred thickness of the sacrificial layer 104', which is dependent on the warp or bend of the diaphragms 108. is approximately 100 nm to approximately 5 μm. If the thickness of the sacrificial layer 104' is less than approximately 100 nm, the warped diaphragms 108 tend to be contacted with the underlying interlayer dielectric layer 103. If the thickness of the sacrificial layer 104' is greater than approximately 5 µm, the sacrificial layer 104' is difficult to be actually formed by the popular CVD process.

The typical warp of the diaphragms 108 is 0.5 µm or less when the diaphragms 108 are 100 µm square. Therefore, it is more preferred that the thickness of the sacrificial layer 104' is approximately 0.5 µm or more so that the layer 104' is not contacted with the underlying interlayer dielectric layer 103.

The contact holes 111 are used for electrically connecting the leg wiring lines 109a and 109b to the IC 102. Therefore, if the sacrificial layer 104' and the dielectric layer 105 become excessively thick, the contact holes 111 will be excessively deep. Thus, the preferred thickness of the sacrificial layer 104' is approximately 0.5 µm to approximately 1.5 µm.

The patterned, island-like dielectric layer 105 is then annealed in a nitrogen atmosphere at a temperature of 900° C. for approximately 60 minutes. Through this annealing process, the top edges a of the remaining island-like dielectric layer 105 are smoothed.

Figure 4D:
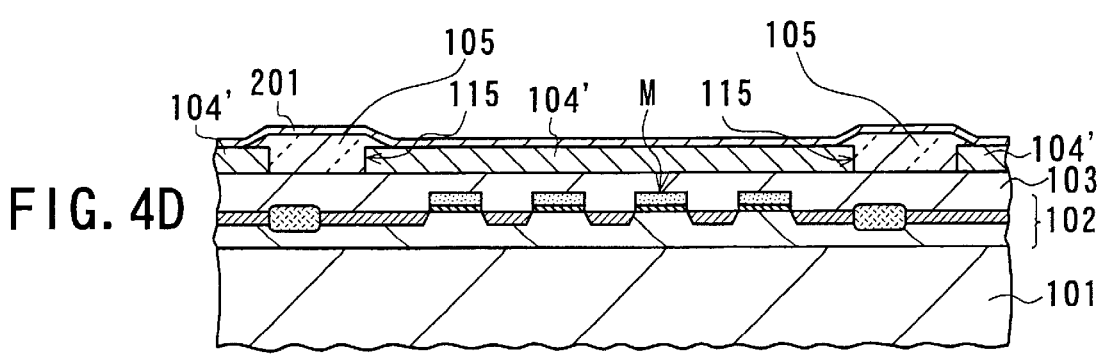

Fifth, as shown in FIG. 4D, the dielectric layer 201 is formed on the remaining sacrificial layer 104' and dielectric layer 105 to form the diaphragms 108 and the legs 107a and 107b. The dielectric layer 201 may be made of a sane material as that of the dielectric layer 103 or 105.

The diaphragms 108 and the legs 107a and 107b may be formed by the dielectric layer 105. However, in this first embodiment, the dielectric layer 201 is additionally provided for forming the diaphragms 108 and the legs 107a and 107b. The reason is that the dielectric layer 201 is located to cover the smoothed top edges a of the remaining island-like dielectric layer 105 and as a result, the surface steps of the dielectric layer 201 will be very low.

The size or area b of the island-like dielectric layer 105 as shown in FIG. 4C is preferably set to be greater than the size of the hollow spaces 115 of the remaining sacrificial layer 104' by 0 to 10 µm. For example, when the dielectric layer 105 is made of BPSG or PSG, it is more preferred that the size b of the island-like dielectric layer 105 is greater than the size of the hollow spaces of the remaining sacrificial layer 104' by approximately 4 to 6 µm.

Figure 4E:
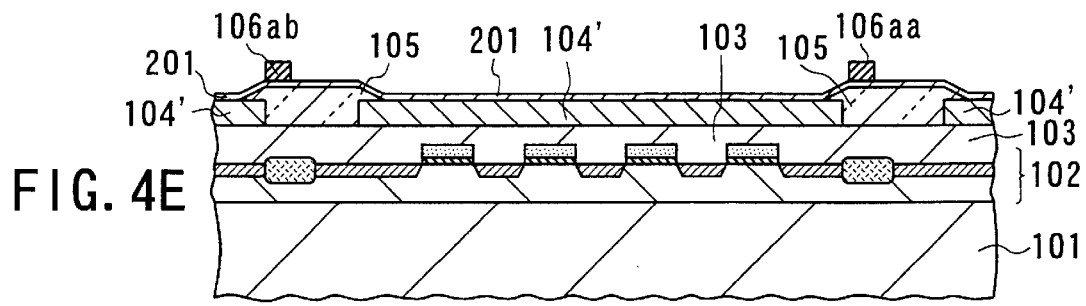
Figure 4F:
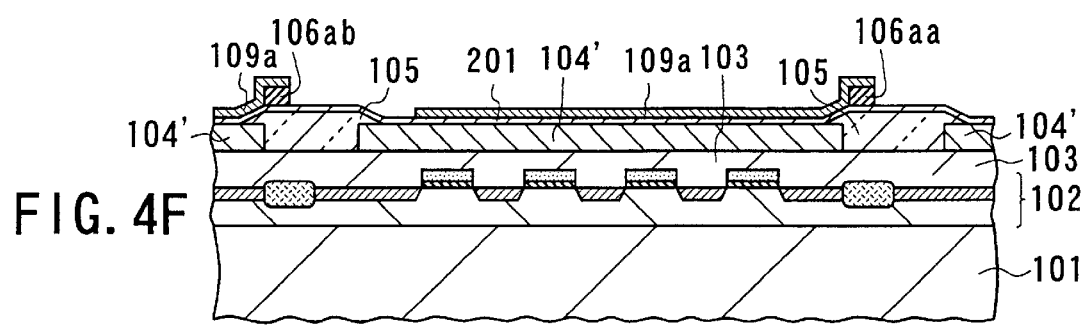

Sixth, a titanium silicide layer (not shown) is formed on the dielectric layer 201 to cover the circuit wiring lines 106aa and 106ab, as shown in FIG. 4E. The titanium silicide layer is then patterned to form the leg wiring lines 109a and 109b on the legs 107a and 107b, as shown in FIGS. 4F and 6A.

Figure 4G:
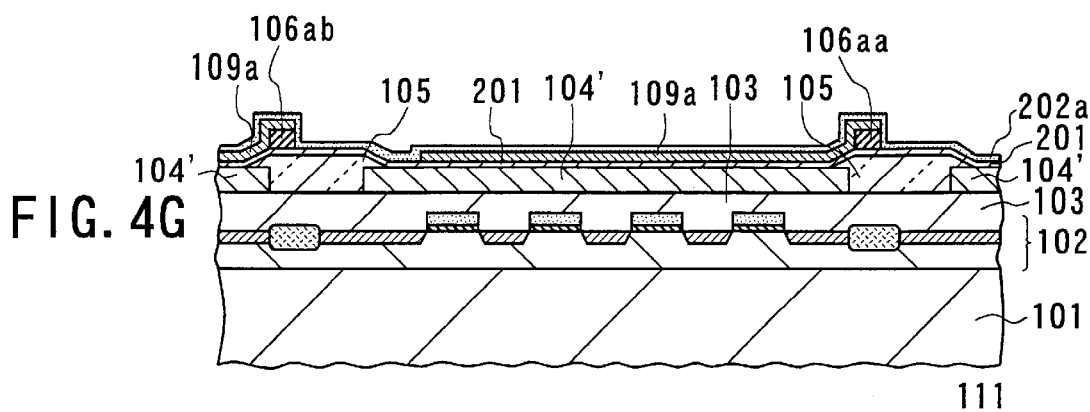

Seventh, the dielectric layer 202a is formed on the dielectric layer 201 to cover the wiring lines 109a and 109b, as shown in FIGS. 4G and 6B.

Figure 4H:
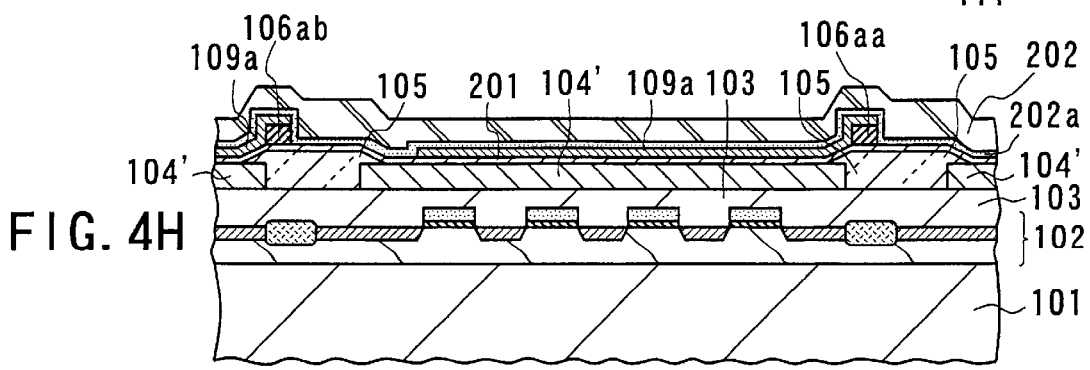
Figure 41:
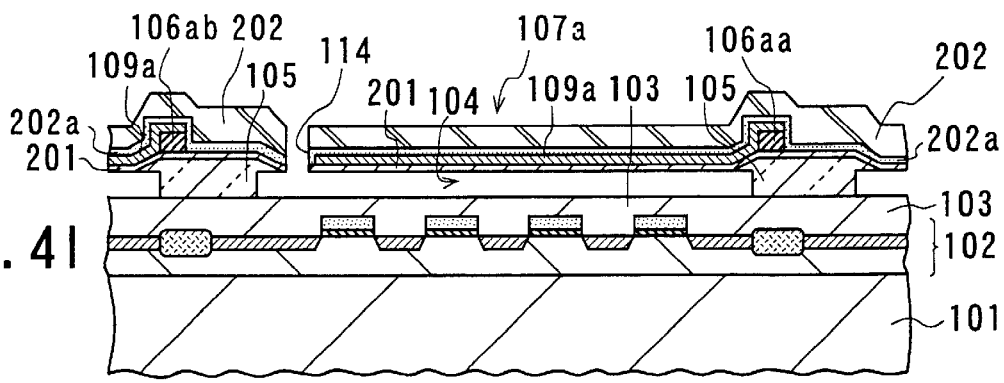

Eighth, the dielectric layer 202 is formed on the dielectric layer 202a to cover the thermoelectric converter elements 110, as shown in FIGS. 4H and 6C.

Ninth, the slits 114a and 114b are formed by etching to penetrate the dielectric layers 202, 202a, and 201, as shown in FIGS. 4I and 6D.

Finally, the sacrificial layer 104' is entirely removed by wet etching through the slits 114a and 114b thus formed, thereby forming the cavities 104 under the diaphragms 108. Thus, the diaphragms 108 and the legs 107a and 107b are formed, as shown in FIGS. 4I, 5, and 6D.

Through the above-described process steps, the semiconductor device according to the first embodiment is fabricated.

The operation of the semiconductor device according to the first embodiment of the present invention is explained below.

The output electric signals of the thermoelectric converter elements or bolometers 110, which are arranged in a matrix array, are successively read out with the use of the switching MOSFETs M of the IC 102. Therefore, the read-out time $t_1$ of each diaphragm 108 is expressed as $$t_1 = t_0/N$$

where $t_0$ is the frame read-out time (i.e., the read-out time for all the pixels), and N is the total number of the diaphragms 108.

For example, when $t_0$ is 33 msec and N is 128×128, the read-out time $t_1$ is approximately 2 µsec.

The electric current flowing through each bolometer 110, which varies with the TCR of the bolometer 110 and the read-out time $t_1$, is approximately 2 to 3 mA for the titanium bolometer 110.

The electric resistance of the bolometer 110 varies with its material. If the electric resistance of the bolometer 110 is greater than approximately 10 kΩ, the inter-terminal voltage of each bolometer 110 will be 20 to 30 V and therefore, the necessary withstand voltage for the read-out circuit will be excessively high. Thus, it is preferred that the electric resistance of the bolometer 110 is set as approximately 10 kΩ or less.

If the electric resistance of the bolometer 110 is less than approximately 1 kΩ, the electric resistance of the wiring lines 109 and the MOS switching circuit excluding the bolometers 110 becomes relatively high, thereby arising a problem that the signal voltage level is lowered and/or the noise level is raised.

Here, the IC 102 amplifies the weak, electric output signal from the converter elements 110 and compensates the non-linearity of a specific relationship between the temperature and the electric output signal. Thus, the correct electric output signal is derived through the IC 102.

With the semiconductor device according to the first embodiment of the present invention, since the leg wiring lines 109a and 109b (i.e., the electric paths) of the diaphragms 108 are made of titanium silicide (TiSi$_2$) having a low electric resistance and a high thermal resistance, the heat transmission between the diaphragms 108 and the substrate 101 through the leg wiring lines 109a and 109b is suppressed. This is performed without decreasing the cross section of the legs 107a and 107b.

As a result, each of the diaphragms 108 has an improved thermal shielding or blocking capability from the substrate 101 without lowering the mechanical strength of the legs 107a and 107b of the diaphragms 108 and without degrading the fabrication yield.

Also, the legs 107a and 107b are made of titanium silicide (TiSi$_2$). Therefore, the electric resistance of the leg wiring lines 109a and 109b is decreased to thereby reduce the voltage drop caused by the leg wiring lines 109a and 109b. Thus, the (S/N) is improved without degrading the fabrication yield.

In the first embodiment, since the 1/f-noise level in the thermoelectric converter elements 110 is lowered. the (S/N) is further improved.

Besides, it is typical that the thermal conductivity of the dielectric layers 201, 202a, and 202 for forming the diaphragms 108 and the legs 107a and 107b is sufficiently low. Especially, the thermal conductivity of $SiO_2$ is very low (i.e., approximately 0.01 W/cm·K). Therefore, the thermal conductivity of each diaphragm 108 is determined by the thermal conductivity of the corresponding leg wiring lines 109a and 109b made of titanium silicide.

The electric resistivity of a popular metal such as Al, Cu, and Pt is approximately equal to or slightly less than that of titanium silicide. However, the thermal conductivity of the popular metals is approximately 1 to 5 W/cm·K, which is approximately five or ten times as large as that of titanium silicide. Therefore, the heat transmission from each diaphragm 108 to the substrate 101 can be suppressed by the leg wiring lines 109a and 109b made of titanium silicide, which increases the sensitivity of the semiconductor device according to the first embodiment up to five or ten times as much as that of titanium.

Also, since the electric resistivity of titanium silicide is one-fourth (¼) of that of titanium, the voltage drop in the leg wiring lines 109a and 109b is suppressed and as a result, the signal voltage level outputted from the thermoelectric converters or bolometers 110 is prevented from lowering.

The leg wiring lines 109a and 109b made of titanium silicide are fabricated by the following methods.

In the first method, a polysilicon or amorphous silicon layer is formed and then, a titanium layer is formed on the polysilicon or amorphous silicon layer thus formed by sputtering. Further, the titanium layer formed on the polysilicon or amorphous silicon layer is annealed or sintered for silicidation reaction. Thus, titanium silicide is fabricated.

In the second method, titanium silicide is directly sputtered using a target of titanium silicide.

The first method using amorphous silicon is most preferred because the electric resistivity of the wiring lines 109 can be set as very low.

The growth of the amorphous silicon layer may be performed by a Low-Pressure CVD (LPCVD) process at a low temperature of approximately 500° C.

The annealing or sintering of the polysilicon or amorphous silicon is preferably performed by a lump anneal process at a temperature of approximately 700 to 900° C. for approximately 30 seconds. The reason is that the resulting titanium silicide has a stoichiometric composition (i.e., $TiSi_2$) of the C54 crystal structure with a low electric resistivity.

As the silicides of titanium, there have been known $Ti_5Si_3$, TiSi, $TiSi_2$, and so on. However, $TiSi_2$ having the C54 crystal structure is most preferred for this first embodiment because of its lowest electric resistivity. The titanium silicide produced by a popular fabrication process is usually polycrystalline and therefore, it is sufficient for the present invention that each crystal grain of the polycrystalline titanium silicide is expressed as $TiSi_2$ and it has the C54 crystal structure.

Even if titanium or silicon is excessive and it is left unreacted at the grain boundaries, the polycrystalline titanium silicide ($TiSi_x$) has a wanted property within a specific range. Specifically, when the polycrystalline titanium silicide is expressed as $TiSi_x$, a preferable range of x is 1.5 to 2.5, a more preferable range of x is 1.8 to 2.2, and a most preferable range of x is 1.9 to 2.1.

The thermoelectric converter elements or bolometers 110 may be made of the following material.

When the thermoelectric converter elements 110 is of the thermocouple type, p- or n-type polysilicon may be used. When the thermoelectric converter elements 110 is of the pyroelectric type, zirconium (Zr)-doped lead titanate system ceramic (i.e., PZT) or lanthanum (La)-doped lead titanate system ceramic (i.e., PLZT) may be used.

When the thermoelectric converter elements 110 is of the bolometer type, any metal such as Ti and Pt, any silicide, and any oxide semiconductor may be used. However, the following conditions (i), (ii), and (iii) need to be satisfied.

(i) Since a bolometer utilizes the temperature change of electric resistance, the temperature coefficient of electric resistance (TCR) needs to be as large as possible.

(ii) A current needs to be flown through a bolometer, which is unavoidable for detecting the electric resistance. Therefore, the 1/f noise due to the current needs to be suppressed.

(iii) To realize a low price, the material should be readily treated in the popular fabrication processes of silicon ICs.

As large-TCR materials, vanadim oxide ($V_xO_y$) and titanium oxide ($Ti_xO_y$) are known, where x and y are real numbers greater than zero. However, $V_xO_y$ is not preferred from the view point of the above conditions (ii) and (iii). $Ti_xO_y$ is not preferred from the view point of the above condition (ii).

Titanium is preferred from the view point of the above conditions (ii) and (iii). However, in this case, the obtainable sensitivity is limited because the TCR is comparatively small. If not only the bolometers 110 but also the wiring lines 109a and 109b are made of titanium, there is an advantage that the fabrication cost is effectively lowered. Thus, this is preferred for the application necessitating the low cost.

Similarly. not only the bolometers 110 but also the wiring lines 109a and 109b may be made of a metal silicide such as titanium silicide. In this case, there is the same advantage that the fabrication cost is effectively lowered.

Titanium oxide ($Ti_xO_y$) generates the comparatively large 1/f noise. The 1/f noise varies inversely proportional to the carrier density and therefore, the 1/f noise decreases with the decreasing electric resistivity. It is known that the electric resistivity of $Ti_xO_y$ is lowered by doping a specific element into $Ti_xO_y$. This means that the 1/f noise of $Ti_xO_y$ is decreased by doping a specific, element into $Ti_xO_y$.

Copper oxide ($Cu_xO_y$) with a high TCR and a low electric resistivity is fabricated if the growth condition is suitably adjusted. It is known that the electric resistivity of $Cu_xO_y$ is lowered by doping a specific element into $Cu_xO_y$. This means that the 1/f noise of $Cu_xO_y$ is decreased by doping a specific element into $Cu_xO_y$.

Copper titanium oxide ($Cu_xTi_yO_z$) with a high TCR and a low electric resistivity, where x, y, arld z are real numbers greater than zero, is fabricated if the growth condition is suitably adjusted. It is known that the electric resistivity of $Cu_xTi_yO_z$ is lowered by doping a specific element into $Cu_xTi_yO_z$. This means that the 1/f noise of $Cu_xTi_yO_z$ is decreased by doping a specific element into $Cu_xTi_yO_z$.

As the doping element for $Ti_xO_y$, the group IIA to IVA elements and the transitional elements in the periodic law table and their compounds may be used. For example, In, Sn, Nb, Ba, Sr, Pb, Zr, Cu, Pt, Co, Ru, and Ta, and their compounds are preferably used. However, any other element or compound may be used if it has a function of lowering the electric resistivity.

Ba, Sr, Pb, and Zr, have been recently used for Ferroelectric Random-Access Memories (FRAMs) Cu, pt, Co, and Ru, have been popularly used for wiring materials in ICs. Ta has been popularly used for a ferroelectric capacitor film of Dynamic RAMs (DRAMs). These elements may be readily used in the fabrication processes of silicon ICs.

The reason why the electric resistivity is lowered by doping at least one of these elements is not clear. However, this reason may be explained in the following way.

In $Ti_xO_y$, the electrons tend to be localized in the Ti element and the small number of electrons are free. By doping the element or compound into $Ti_xO_y$, the energy band structure is changed in the vicinity of the Ti atoms to thereby increase the carrier, resulting in decrease of the electric resistivity.

As the doping element for $Cu_xO_y$, the group IIA to IVA elements and the transitional elements in the periodic law table and their compounds may be used. For example, Ba, Sr, Pb, Zr, Ti, Pt, Co, Ru, and Ta, and their compounds are preferably used. However, any other element or compound may be used if it has a function of lowering the electric resistivity.

As the doping element for $Cu_xTi_yO_z$, the group IIA to IVA elements and the transitional elements in the periodic law table and their compounds may be used. For example, Ba, Sr, Pb, Zr, Pt, Co, Ru, and Ta, and their compounds are preferably used. However, any other element or compound may be used if it has a function of lowering the electric resistivity.

The doping amount of the doping element or compound is properly adjusted so that the doping element does not become the main constituent. For examples the atomic weight or molar number of the doping element or compound is properly adjusted not to exceed the atomic weight of Ti and/or Cu according to the necessity or purpose.

An article written by Katsufuji et al., Japan Journal of Solid-State Physics, Vol. 30, NO. 1, pp15–25, 1995, discloses that $LaTiO_{3.03}$, which is produced by doping La into $Ti_xO_y$, showed a low electric resistivity ρ of 1.9 Ω·cm and a TCR of 0.71%/K.

An article written by G. P. Kelkar et al., Journal of American Ceramic Society, Vol. 76, NO. 7, pp1815–1820. 1993, discloses that $Ti_{4\ Cu2}O$ and $Ti_3Cu_3O$, which is produced by doping Cu into $Ti_xO_y$, showed a low electric resistivity ρ of $5 \times 10^{-4}$ Ω·cm.

An article written by Hase et al., Journal of Materials Research. Vol. 9, No 6, pp1337–1341, 1994, discloses that $YBa_2Cu_3O_6$, which is produced by doping Y and Ba into $Cu_xO_y$, showed a low electric resistivity ρ of $4.6 \times 10^{-3}$ Ω·cm.

Next, the electric resistance ratio between the leg wiring lines 109a and 109b and the thermoelectric converter elements 110 will be explained below.

The thermal conductance of the diaphragms 108 is typically determined by the thermal conductance of the leg wiring lines 109a and 109b, because the thermal conductivity of the wiring lines 109a and 109b is usually larger than that of the diaphragms 108.

In this case, when the thermal conductance of the diaphragms 108, the electric resistance of the thermoelectric converter elements or bolometer 110, the electric resistance of the leg wiring lines 109a and 109b, and the applied voltage are defined as $G_{th}$, $R_B$, $R_L$, and $V_0$, respectively, the sensitivity Res of the IR sensor device according to the first embodiment is given by the followings expression (1).

$$Res \propto \frac{1}{G_{th}} \cdot \frac{R_B}{R_B + R_L} V_0 \qquad (1)$$

When the Johnson noise, which is independent of the frequency is dominant, the noise voltage $V_n$ is expressed as follows $$V_n = \sqrt{4kT(R_B+R_L)\Delta f} \qquad (2)$$

where k is the Boltzmann's constant. T is the absolute temperature, and Δf is the bandwidth of the circuit.

From the above equations (1) and (2), the S/N of the IR sensor device according to the first embodiment is given by the following equation (3).

$$S/N \propto \frac{1}{G_{th}} \cdot \frac{R_B}{(R_B+R_L)^{2/3}} \qquad (3)$$

When the thermal conductance $G_{th}$ of the diaphragms 108 is typically determined by the thermal conductance of the leg wiring lines 109a and 109b, the thermal conductance $G_{th}$ is inversely proportional to the electric resistance $R_L$ of the leg wiring lines 109a and 109b.

Also, if the specific material of the leg wiring lines 109a and 109b has a thermal conductivity $\sigma_{th}$, an electric conductivity $\sigma_{el}$, a length L. and a cross section A, the following equations (4) and (5) are established.

$$G_{th} = \frac{\sigma_{th}A}{L} \qquad (4)$$

$$R_L = \frac{L}{\sigma_{el}A} \qquad (5)$$

Substituting these equations (4) and (5) into the above equation (3) gives the following equation (6).

$$S/N \propto \frac{R_B R_L}{(R_B+R_L)^{2/3}} \qquad (6)$$

The S/N expressed by the equation (6) is maximized when the electric resistance $R_B$ g of the bolometer 110 is equal to the electric resistance $R_L$ of the leg wiring lines 109a and 109b (i.e., $R_B=R_L$). Therefore, when the thermal conductance $G_{th}$ of each diaphragm 108 is determined by the thermal conductance of the corresponding leg wiring lines 109a and 109b. the S/N of the IR sensor device according to the first embodiment is maximized at $R_B=R_L$.

If the two wiring lines 109a and 109b are provided for each diaphragm 108, the electric resistance $R_L$ of the leg wiring lines 109a and 109b means the sum of the electric resistance of the two wiring lines 109a end 109b.

The thermal conductance $G_{th}$ of the diaphragms 108 may be determined by the thermal conductance of those other than the wiring lines 109a and 109b (for example, the thermal conductance of the radiation and/or that of the dielectric layers). In this case, to maximize the S/N of the IR sensor device according to the first embodiment, the resistance $R_L$ is preferably set as small independent of the resistance $R_B$.

Moreover, even when the thermal conductance $G_{th}$ of the diaphragms 108 is determined by the thermal conductance of the wiring lines 109a and 109b, the thermal conductance $G_{th}$ of the diaphragms 108 may be unable to be lowered due to the thermal time constant. In this case, the S/N of the IR sensor device according to the first embodiment is not always maximized at $R_B=R_L$. The reason is as follows.

The thermal time constant $\tau_{th}$ of the diaphragm 108 is expressed as $\tau_{th}=C_{th}/G_{th}$, where $C_{th}$ is the heat capacity of the diaphragm 108. Therefore, if the thermal conductance $G_{th}$ of the diaphragms 108 becomes small, the thermal time constant $\tau_{th}$ of the diaphragm 108 becomes large, which degrades the thermal response speed of the diaphragm 108. Since the electric resistance $R_L$ of the leg wiring lines 109a and 109b is inversely proportional to the thermal conductance $G_{th}$ of the diaphragms 108, the electric resistance $R_L$ may be unable to be approximately as large as the thermal conductance $G_{th}$.

For example, when the diaphragm 108 is 20 μm to 100 μm square, the thermal conductance $G_{th}$ of the diaphragms 108 will be 0.1 to 1 μW/K and the heat capacity thereof will be 1 to 5 nJ/K. In this case, the thermal time constant $\tau_{th}$ of the diaphragm 108 will be approximately 1 to 50 msec. Since the frame period of television is approximately 17 to 33 msec, there is a disadvantage that a moving object at high speed is difficult to be sensed (in other words, the so-called modulation transfer function degrades) if the thermal time constant $\tau_{th}$ of the diaphragm 108 is comparatively large.

Second Embodiment

Figure 8:
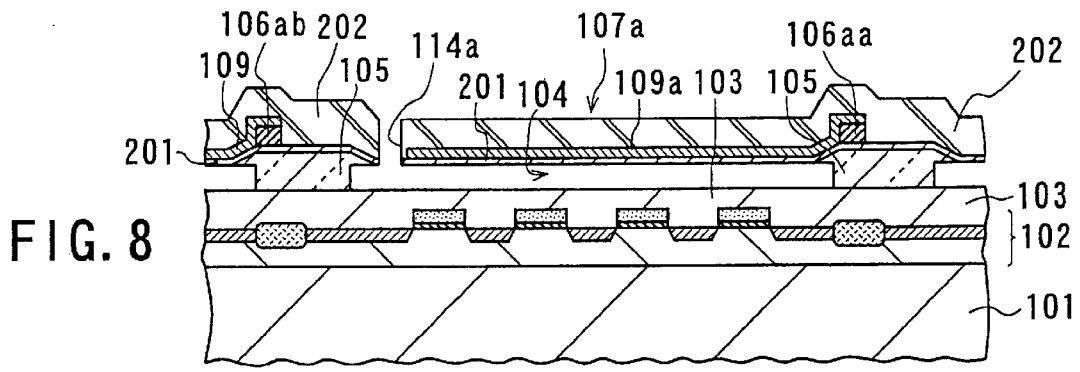
FIG. 8 is a partial, cross-sectional view of a semiconductor device according to a second embodiment of the present invention, which corresponds to FIG. 4I.
Figure 9:
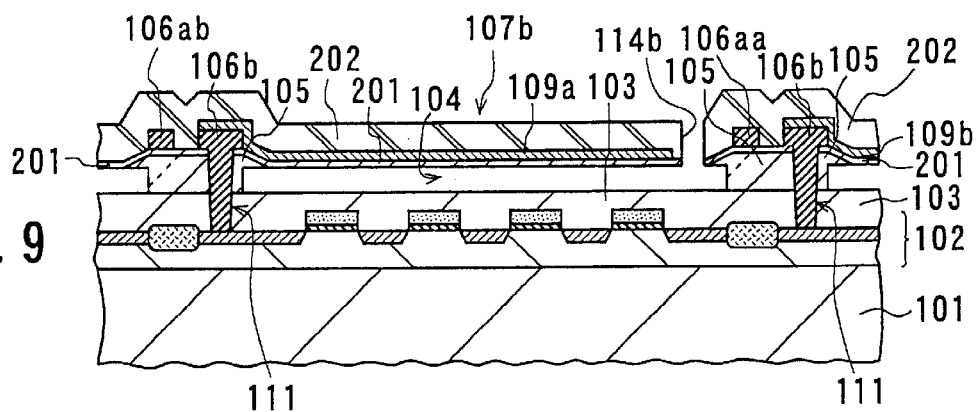
FIG. 9 is a partial, cross-sectional view of the semiconductor device according to the second embodiment of FIG. 8, which corresponds to FIG. 5.
Figure 10:
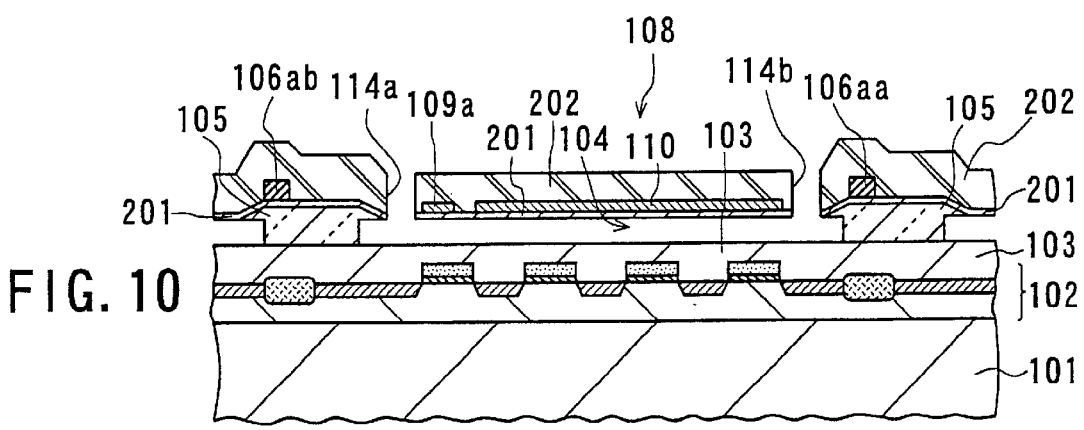
FIG. 10 is a partial, cross-sectional view of the semiconductor device according to the second embodiment of FIG. 8, which corresponds to FIG. 6D.

FIGS. 8, 9, and 10 show a semiconductor device serving as an IR micro-sensor device according to a second embodiment of the present invention.

This device according to the second embodiment has the same configuration as the first embodiment except that each of the bolometers 110 is made of the same material (i.e., titanium silicide) as the leg wiring lines 109a and 109b. Therefore, there is an additional advantage that the fabrication cost is lowered.

Third Embodiment

Figure 11:
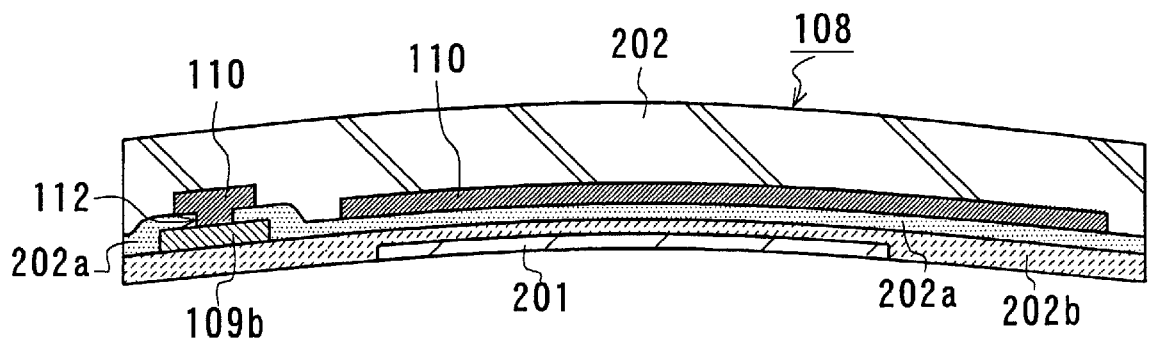
FIG. 11 is an enlarged, partial, cross-sectional view of the diaphragm of the semiconductor device according to a third embodiment of the present invention, which corresponds to FIG. 7.

FIGS. 11 and 13 show a semiconductor device serving as an IR micro-sensor device according to a third embodiment of the present invention.

This device according to the third embodiment has the same configuration as the first embodiment except that the dielectric layer 201 is formed to cover central parts of the diaphragms 108. To cover the exposed parts of the diaphragms 108, a dielectric layer 202b is additionally formed.

Even if the tensile stress of the dielectric layer 201 is excessively strong, the warp of the diaphragm 108 may be adjusted by decreasing the area (i.e., size) and/or shape of the dielectric layer 201 it was found from the inventor's test that the after image problem was able to be prevented from occurring by adjusting the area or size of the dielectric layer 201 to be equal to ¾ of the whole area of the diaphragm 108 or less. An example is shown in FIG. 14.

Fourth Embodiment

Figure 15:
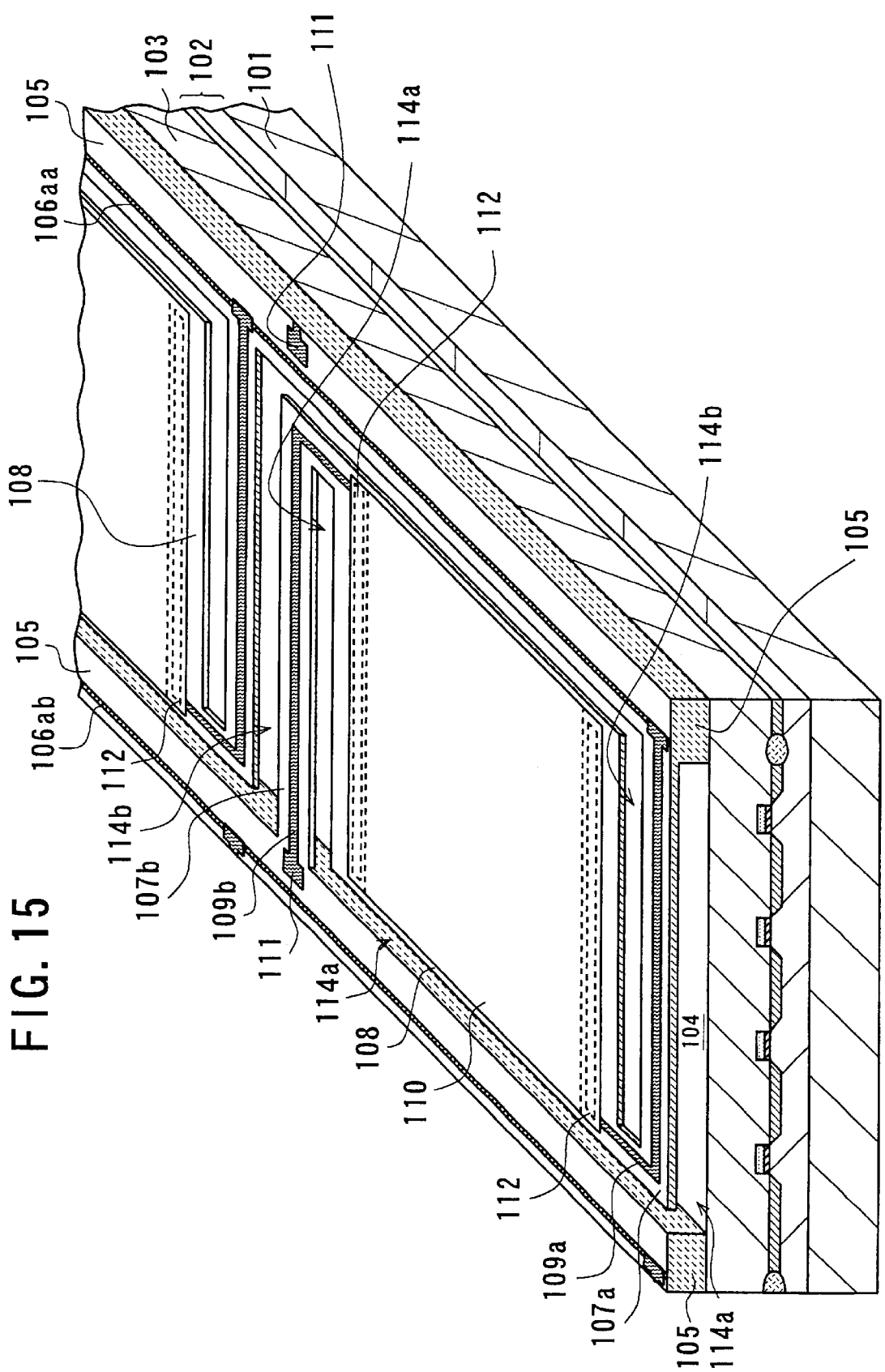
FIG. 15 is a partial, perspective view of a semiconductor device according to a fourth embodiment of the present invention.

FIG. 15 shows a semiconductor device serving as an IR micro-sensor device according to a fourth embodiment of the present invention.

This device according to the fourth embodiment has the same configuration as the first embodiment except that each bolometer 110 is rectangular and is formed to cover the approximately whole surface of a corresponding one of the diaphragms 108.

The contacts 112 between the thermoelectric converter elements 110 and the leg wiring lines 109a and 109b are formed to extend from one end of the diaphragm 108 to the other end thereof to suppress the 1/f-noise level.

In the fourth embodiment, there is an additional advantage that the electric resistance $R_B$ of the bolometer 110 is prevented from being excessively high when the electric resistivity of bolometer 110 is approximately equal to several mΩ·cm or higher. If the electric resistance $R_B$ of the bolometer 110 becomes excessively high, the inter-terminal voltage of the bolometer 110 will be high and as a result, the required withstand voltage of the IC 102 will be higher.

Fifth Embodiment

FIG. 16 shows a semiconductor device serving as an IR micro-sensor device according to a fifth, embodiment of the present invention.

In the device according to the fifth embodiment, similar to the fourth embodiment of FIG. 15, each bolometer 110 is formed to cover the approximately whole surface of a corresponding one of the diaphragms 108. However, unlike the fourth embodiment of FIG. 15, the contacts 112 between the thermoelectric converter elements 110 and the leg wiring lines 109a and 109b are formed to be localized in the vicinity of the corners of the elements 110.

There is an additional advantage that the absorption rate of the incident IR ray is increased. This is because the reflection of the incident IR ray on the diaphragm 108 is decreased by smoothing the surface irregularities of the diaphragm 108 to reduce the reflection of the incident IR ray.

VARIATIONS

In the above-described first to fifth embodiments, the present invention is applied to the semiconductor IR sensor device However, the present invention may be applied to any other device such as a flow or vacuum pressure sensor, an IR-ray generator, and manipulator.

When the present invention is applied to a flow sensor, only one of the diaphragms 108 is required. The plurality of diaphragms 108 need not be arranged in a two-dimensional pattern.

If an electric current is supplied to the converter element, this element generates heat due to the Joule heat, thereby raising the temperature of the diaphragm 108. This temperature raise varies as a function of the velocity of a flowing fluid and therefore, the velocity of the flowing fluid is measured by the present invention using the relationship between the temperature of the converter element and the electric current thereof.

When the present invention is applied to a vacuum sensor, only one of the pixels (i.e., sensing sections) is required, which is the same as the case of the flow sensor.

If an electric current is supplied to an electro thermal converter element or heating resistor, this element generates heat due to the Joule heat, thereby raising the temperature of the diaphragm 108. This temperature raise varies as a function of the vacuum level in a vacuum chamber and therefore, the vacuum level is measured by the present invention using the relationship between the temperature of the element 110 and the vacuum level of the chamber. The IC in the IC region 102 amplifies the weak, electric output signal from the element 110 and compensates the non-linearity of the above relationship, thereby deriving the correct output signal.

When the present invention is applied to an IR-ray generator, an input electric signal is applied to the converter element or elements 110, and IR-ray is generated in the element or elements 110 and is irradiated therefrom as an output.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor device comprising:

a semiconductor substrate;

a diaphragm mechanically connected to said substrate by a thermally-resistive leg;

said diaphragm being electrically insulated and thermally separated from said substrate;

an electric converter element provided on said diaphragm;

said electric converter element conducting conversion between a physical quantity and an electric input/output signal;

an electronic circuit formed on said substrate;

an electric path located on said leg for electrically connecting said electric converter element and said electronic circuit; and said electric path being made of metal silicide to decrease its thermal conductivity without decreasing its electrical conductivity, wherein said electric converter element is made of a material selected from the group consisting of $Ti_xO_y$, $Cu_uO_y$, and $Cu_xTi_yO_z$, each of which is doped with an impurity having an action to decrease its electric resistivity.

2. A device as claimed in claim 1, wherein said doped impurity for $Ti_xO_y$ is at least one selected from the group consisting of In, Sn, Nb, Ba, Sr, Pb, Zr, Cu, Pt, Co, Ru, and Ta, and their compounds.

3. A device as claimed in claim 1, wherein said doped impurity for $Ti_xO_y$ is at least one selected from the group consisting of Ba and Sr, and their compounds.

4. A device as claimed in claim 1, wherein said doped impurity for $Cu_xO_y$ is at least one selected from the group consisting of Ba, Sr, Pb, Zr, Ti, Pt, Co, Ru, and Ta, and their compounds.

5. A device as claimed in claim 1, wherein said doped impurity for $Cu_xO_y$ is at least one selected from the group consisting of Ba and Sr, and their compounds.

6. A device as claimed in claim 1, wherein said doped impurity for $Cu_xTi_yO_z$ is at least one selected from the group consisting of In, Sn, Nb, Ba, Sr, Pb, Zr, Cu, Pt, Co, Ru, and Ta, and their compounds.

7. A device as claimed in claim 1, wherein said doped impurity for $Cu_xO_y$ is at least one selected from the group consisting of Ba and Sr, and their compounds.

8. A device as claimed in claim 1, wherein said diaphragm has a two-layer structure formed by a lower sublayer with a tensile stress and an upper sublayer with a compressive stress, said upper sublayer being stacked onto said lower sublayer;

and wherein said two-layer structure has a bimetal function to form a convex cross-section with respect to said substrate.

9. A device as claimed in claim 8, wherein said lower sublayer has an area ¾ times as much as said diaphragm.

10. A semiconductor device comprising:

a semiconductor substrate;

a diaphragm mechanically connected to said substrate by a thermally-resistive leg, said diaphragm being electrically insulated and thermally separated from said substrate;

an electric converter element provided on said diaphragm, said electric converter element converting between a physical quantity and an electric input/output signal;

an electronic circuit formed on said substrate; and an electric path located on said leg for electrically connecting said electric converter element and said electronic circuit, said electric path consisting essentially of metal silicide to decrease its thermal conductivity without decreasing its electrical conductivity, wherein said electric converter element has approximately a same electric resistance as that of said electric path on the leg.

* * * * *